United States Patent
Imaizumi et al.

(10) Patent No.: US 12,140,717 B2
(45) Date of Patent: Nov. 12, 2024

(54) NEUTRON BEAM DETECTING DEVICE, NEUTRON BEAM DETECTING METHOD, AND NEUTRON BEAM DETECTION PROGRAM

(71) Applicant: TOHOKU UNIVERSITY, Sendai (JP)

(72) Inventors: Mitsuru Imaizumi, Chofu (JP); Yasuki Okuno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 211 days.

(21) Appl. No.: 17/998,890

(22) PCT Filed: Jan. 28, 2022

(86) PCT No.: PCT/JP2022/003344
§ 371 (c)(1),
(2) Date: Nov. 15, 2022

(87) PCT Pub. No.: WO2022/163817
PCT Pub. Date: Aug. 4, 2022

(65) Prior Publication Data
US 2023/0213668 A1 Jul. 6, 2023

(30) Foreign Application Priority Data

Jan. 28, 2021 (JP) .................. 2021-012373

(51) Int. Cl.
*G01T 3/00* (2006.01)
*G01T 3/08* (2006.01)
(Continued)

(52) U.S. Cl.
CPC .......... *G01T 3/08* (2013.01); *H01L 31/02322* (2013.01); *H01L 31/118* (2013.01)

(58) Field of Classification Search
None
See application file for complete search history.

(56) References Cited

U.S. PATENT DOCUMENTS

| 8,541,756 B1 * | 9/2013 | Treas ................. G01N 23/10 250/398 |
| 10,914,848 B1 * | 2/2021 | Okandan ............... G01T 1/24 |

(Continued)

FOREIGN PATENT DOCUMENTS

| JP | 2016539324 | 12/2016 |
| JP | 2016539324 A | 12/2016 |

(Continued)

OTHER PUBLICATIONS

"International Application Serial No. PCT JP2022 003344, International Search Report dated Mar. 22, 2022", w English Translation, (Mar. 22, 2022), 4 pgs.

(Continued)

*Primary Examiner* — Hoon K Song
(74) *Attorney, Agent, or Firm* — Schwegman Lundberg & Woessner, P.A.

(57) ABSTRACT

A neutron beam detecting device according to the invention includes: a first solar cell-type detector that is provided with, on a surface thereof, a conversion film for converting neutrons into photons or any charged particle beam among alpha particles, protons, lithium nuclei, gamma rays or beta rays, and generates a current in response to incident radiation; a radiation detector that generates a current insensitive to neutrons as an output signal in response to the radiation incident; a current measuring device that detects, as signals, the current generated by the first solar cell-type detector and the current generated by the radiation detector in response to the incident radiation; and a flux calculating unit that compares the current signals from the detectors which are detected by the current measuring device. The flux calculating unit associates the detected current signals from the solar cell-type detector and the radiation detector with a relation between a flux of incident radiation of a predetermined type obtained in advance and the detected currents (Continued)

from the solar cell-type detector and the radiation detector, and calculates a flux of a neutron beam.

15 Claims, 8 Drawing Sheets

(51) Int. Cl.
    *H01L 31/0232*    (2014.01)
    *H01L 31/118*    (2006.01)

(56) References Cited

U.S. PATENT DOCUMENTS

| | | | |
|---|---|---|---|
| 2017/0017002 A1 | 1/2017 | Kono et al. | |
| 2017/0200762 A1 | 7/2017 | Okandan et al. | |

FOREIGN PATENT DOCUMENTS

| | | |
|---|---|---|
| JP | 2017026595 | 2/2017 |
| JP | 2017026595 A | 2/2017 |
| JP | 2018141749 | 9/2018 |
| JP | 2018141749 A | 9/2018 |
| JP | 2019145751 | 8/2019 |
| JP | 2019145751 A | 8/2019 |
| WO | 2015093690 | 6/2015 |
| WO | WO-2015093690 A1 | 6/2015 |

OTHER PUBLICATIONS

Okuno, Yasuki, "Development of high-level radiation dosimeter by applying solar cells for decommissioning of nuclear reactor", vol. 66th, p. ROMBUNNO 9p-W933-9, (Feb. 25, 2019), 1 pg.

Okuno, Yasuki, "Development of highly radiation-resistant dosimeters that do not require external power source by the application of compound solar cells", vol. 67th, p. ROMBUNNO 13p-A202-1, (Feb. 28, 2020), 1 pg.

Okuno, Yasuki, et al., "Development of high-level radiation dosimeter by applying solar cells for decommissioning of nuclear reactor", vol. 66th, p. ROMBUNNO 9p-W933-9, (Feb. 25, 2019), 1 pg.

Okuno, Yasuki, et al., "Development of highly radiation-resistant dosimeters that do not require external power source by the application of compound solar cells", vol. 67th, p. ROMBUNNO 13p-A202-1, (Feb. 28, 2020), 1 pg.

\* cited by examiner

NEUTRON BEAM DETECTING DEVICE, NEUTRON BEAM DETECTING METHOD, AND NEUTRON BEAM DETECTION PROGRAM

PRIORITY APPLICATIONS

This application is a U.S. National Stage Filing under 35 U.S.C. § 371 from International Application No. PCT/JP2022/003344, filed on Jan. 28, 2022, and published as WO2022/163817 on Aug. 4, 2022, which claims the benefit of priority to Japanese Application No. 2021-012373, filed on Jan. 28, 2021; the benefit of priority of each of which is hereby claimed herein, and which applications and publication are hereby incorporated herein by reference in their entireties.

TECHNICAL FIELD

The present invention relates to a neutron beam detecting device, a neutron beam detecting method, and a neutron beam detection program.

BACKGROUND ART

As a technique of detecting a neutron beam, there is a known method of ionizing sealed gas molecules by alpha particles generated from neutrons and a gas or a solid containing boron or the like that generates alpha particles by neutrons, and collecting generated charges on an electrode applied with a high voltage to detect the generated charges.

There is also a known method of detecting a neutron beam by amplifying an optical signal from a substance called a scintillator, which emits light by the energy of the alpha particles, as an electrical signal using a photomultiplier tube or the like. At present, these two detecting methods are widely known as representative and general detecting methods among neutron beam detecting methods.

In addition, regarding a neutron detector using a semiconductor, techniques described in the following PTL 1 and PTL 2 are known.

In the detector of the technique according to PTL 1, an intrinsic semiconductor layer containing boron for converting neutrons into alpha rays is inserted between a p/n junction of a diode structure.

In the detector of the technique according to PTL 2, an organic conversion layer made of an organic material is used as a semiconductor material without using an element for converting neutrons into alpha rays, and a voltage needs to be applied for an operation of the detector.

In a different radiation measuring sensor according to PTL 3, a pin junction electrode or a Schottky junction electrode of a diode is produced, and is formed with, on a surface thereof, a film for detecting an X ray and a gamma ray, an alpha ray and a beta ray, a neutron beam or the like. This sensor measures a scintillation amount generated by the X ray and the gamma ray, measures the transmittance of the alpha ray and the beta ray, and measures an amount of a chemical reaction caused by a neutron reactive material.

CITATION LIST

Patent Literature

PTL 1: JP-A-2018-141749
PTL 2: JP-A-2019-145751
PTL 3: JP-A-2016-539324

SUMMARY OF INVENTION

Technical Problem

Regarding the neutron detector using the ionization of gas described above, in order to acquire sufficient detection sensitivity, a certain volume of gas is required, which inevitably increases a size of a detection unit.

In addition, it is necessary to use an expensive gas such as boron trifluoride or $^3$He as a sealed gas, and a power supply for voltage application is required, and thus the detector becomes expensive.

Regarding the detection devices according to PTL 1 and PTL 2, it is necessary to design and manufacture a dedicated detection device having a special structure, and the price of the detector becomes high when the cost for establishing stability and reliability of product performances is included.

In the different radiation measuring sensor according to PTL 3, the radiation passing through each film is a fine analog signal, and the signal conversion is not easy. Considering mixed noise or the like, the sensor is considered to be of low practical use. In addition, since it is necessary to measure a pulse signal amplified by a preamplifier using an external power supply, signal detection is not easy.

The invention has been made in view of the above-described problems in the related art, and an object of the invention is to provide a neutron beam detecting device capable of easily detecting neutrons with a small detector.

Another object of the invention is to provide a neutron beam detecting method and a neutron beam detection program that use the neutron beam detecting device.

Solution to Problem

The invention has the following configurations as means for solving the above problems.

(1) A neutron beam detecting device according to an embodiment of the invention is a neutron beam detecting device for detecting a neutron beam, and includes: a solar cell-type detector provided with, on a surface thereof, a conversion film configured to convert neutrons into a predetermined radiation, and configured to generate a current in response to radiation incident through the conversion film; a radiation detector configured to generate a current insensitive to neutrons as an output signal in response to the incident radiation; a current measuring device configured to detect, as signals, the current generated by the solar cell-type detector and the current generated by the radiation detector in response to the incident radiation; and a flux calculating unit configured to compare the current signal generated by the solar cell-type detector and the current signal generated by the radiation detector which are detected by the current measuring device. The flux calculating unit has a function of associating the current signals from the solar cell-type detector and the radiation detector detected by the current measuring device with a relation between a flux of an incident radiation of a predetermined type obtained in advance and the detected currents from the solar cell-type detector and the radiation detector, and calculating a flux of a neutron beam based on a result of the association.

The solar cell-type detector described here is preferably a PN junction element that is designed in advance to enable output of a detected signal obtained by internal potential driving by increasing a current output caused by light irradiation, and to increase radiation resistance. In the case of this element, a photodiode detector designed to require an external voltage application or a signal amplification by a preamplifier and this element are clearly distinguished in the necessity of an external power supply involved in function activation and the presence or absence of the radiation resistance.

According to the present embodiment, the neutron beam detecting device may be a solar cell according to an existing technique, and it is not necessary to design and manufacture a dedicated detection device having a special structure. In addition, an internal electric field of a diode structure of a p/n junction is used to extract charges generated by absorbing photons or any charged particle beam among alpha particles, protons, lithium nuclei, gamma rays or beta rays, which does not need to apply a voltage. Therefore, a voltage source or a circuit or a wiring for voltage application is not required, and a neutron detection system may have a simple configuration and can be reduced in cost.

Further, it is sufficient to achieve the structure of the present embodiment by using a detector having a size of about 1 cm square as the solar cell-type detector, and therefore a neutron detection unit can be reduced in size. As a result, it is possible to measure a neutron beam at a place where it is difficult to install the detector and the neutron beam cannot be measured hitherto, such as in the direct vicinity of a neutron generation unit of an accelerator-type neutron generation device.

(2) In the neutron beam detecting device according to the invention, it is preferable that the solar cell-type detector is a first solar cell-type detector, the radiation detector is a second solar cell-type detector that is not provided with a conversion film for converting neutrons into a predetermined radiation, and the flux calculating unit calculates the difference between the current signal from the first solar cell-type detector and the current signal from the second solar cell-type detector, and has a function of associating the difference with a relation between a flux of incident neutrons of a predetermined type obtained in advance and the difference between the current signal from the first solar cell-type detector and the current signal from the second solar cell-type detector, and calculating the flux of the neutron beam based on the result of the association.

(3) In the neutron beam detecting device according to the invention, it is preferable that the neutron beam detecting device has a function of calculating the flux of neutrons based on a calibration curve based on a linear function, a power function or a quadratic function stored in the flux calculating unit in advance.

(4) In the neutron beam detecting device according to the invention, it is preferable that the conversion film is made of any one of: a single element among lithium, boron, or gadolinium containing an isotope having a function of converting neutrons into photons or any charged particle beam among alpha particles, protons, lithium nuclei, gamma rays or beta rays; a nitride, a fluoride, an oxide, or other compounds of lithium, boron, or gadolinium containing an isotope having a function of converting neutrons into photons or any charged particle beam among alpha particles, protons, lithium nuclei, gamma rays or beta rays; or a mixture of the single element and the compound.

(5) In the neutron beam detecting device according to the invention, it is preferable that the solar cell-type detector is made of any one of: a binary compound semiconductor having a band gap of 0.8 eV to 2.2 eV, such as gallium arsenide, indium phosphide, and cadmium telluride; a compound semiconductor that is a multinary mixture of ternary or quaternary or more, such as indium gallium phosphide, aluminum gallium arsenide, and copper indium sulfide selenide; or a perovskite semiconductor.

(6) A neutron beam detecting method according to the invention is a neutron beam detecting method for detecting a neutron beam, and includes: using a solar cell-type detector and a radiation detector, the solar cell-type detector being provided with, on a surface thereof, a conversion film configured to convert neutrons into a predetermined radiation, and being configured to generate a current in response to radiation incident through the conversion film, the radiation detector being configured to generate a current insensitive to neutrons as an output signal in response to the incident radiation; causing a current measuring device to detect, as signals, a current generated by the solar cell-type detector and a current generated by the radiation detector in response to the incident radiation; causing a flux calculating unit to compare the current signal generated by the solar cell-type detector and the current signal generated by the radiation detector which are detected by the current measuring device; and causing the flux calculating unit to associate the current signals from the solar cell-type detector and the radiation detector detected by the current measuring device with a relation between a flux of incident radiation of a predetermined type obtained in advance and the detected currents from the solar cell-type detector and the radiation detector, and to calculate a flux of a neutron beam based on a result of the association.

A neutron beam detection program according to the invention is a program used in a neutron beam detecting method for detecting a neutron beam, and is executed to: use a solar cell-type detector and a radiation detector, the solar cell-type detector being provided with, on a surface thereof, a conversion film configured to convert neutrons into a predetermined radiation, and being configured to generate a current in response to radiation incident through the conversion film, the radiation detector being configured to generate a current insensitive to neutrons as an output signal in response to the incident radiation; cause a current measuring device to detect a current generated by the solar cell-type detector and a current generated by the radiation detector in response to the incident radiation; cause a flux calculating unit to compare the current signal generated by the solar cell-type detector and the current signal generated by the radiation detector which are detected by the current measuring device; and cause the flux calculating unit to associate the current signals from the solar cell-type detector and the radiation detector detected by the current measuring device with a relation between a flux of incident radiation of a predetermined type obtained in advance and the detected currents from the solar cell-type detector and the radiation detector, and to calculate a flux of a neutron beam based on a result of the association.

Advantageous Effect

According to the invention, it is possible to provide a neutron beam detecting device capable of measuring and calculating a flux of a neutron beam within a wider detection range, at a lower price, within a wider usage temperature range, and in a smaller detection device installation volume.

In addition, according to the invention, it is possible to provide a neutron beam detecting method and a neutron beam detection program that can measure and calculate a flux of a neutron beam within a wider detection range, at a lower price, within a wider usage temperature range, and in a smaller detection device installation volume.

DESCRIPTION OF EMBODIMENTS

First Embodiment

Hereinafter, the details of the invention will be described with reference to the first embodiment of the invention, and the invention is not limited to embodiments to be described below.

Figure 1:
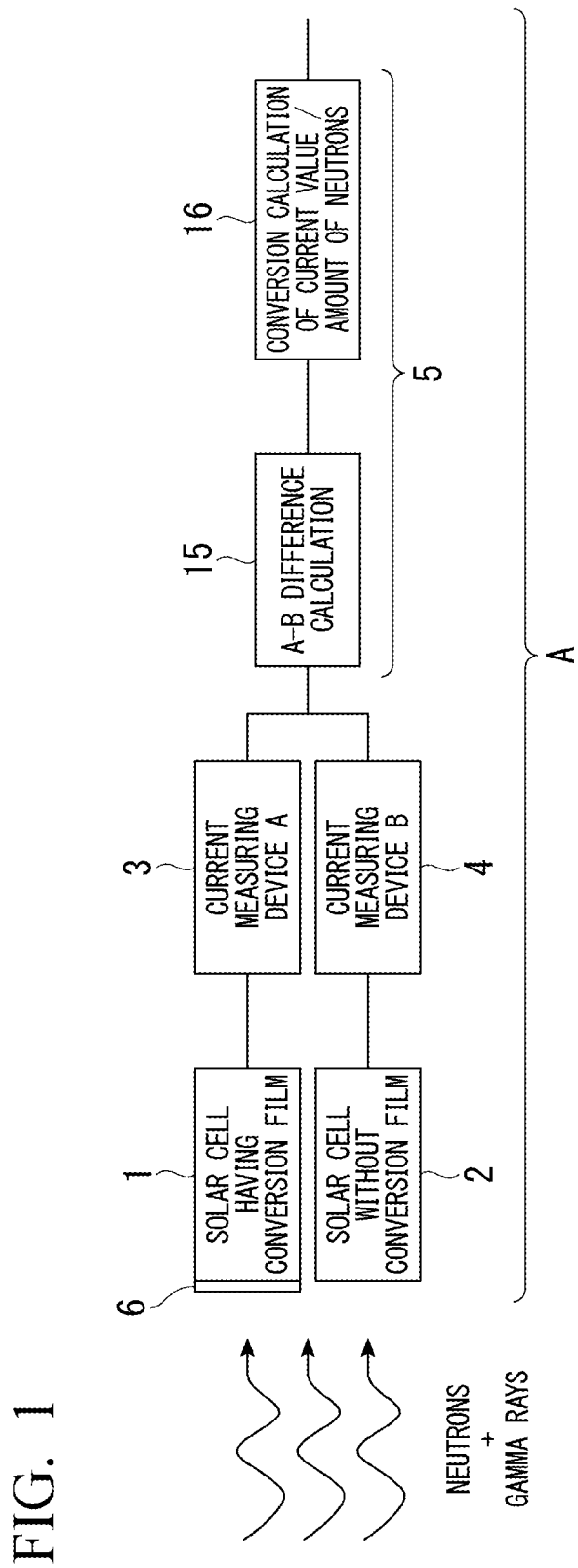
FIG. 1 is a system block diagram showing a neutron beam detecting device according to a first embodiment of the invention.

FIG. 1 is a system block diagram showing a neutron beam detecting device according to the first embodiment of the invention. A neutron beam detecting device A according to the present embodiment includes a first solar cell-type detector 1 having a conversion film 6 to be described later, a radiation detector (second solar cell-type detector) 2 without the conversion film 6, current measuring devices 3 and 4, and a neutron beam flux calculating device 5.

The first solar cell-type detector 1 is a detector that generates a current in response to radiation such as sunlight. The conversion film 6 is laminated on a radiation input unit (light receiving surface) of the first solar cell-type detector 1. The conversion film 6 has a function of generating photons or any charged particle beam among alpha particles, protons, lithium nuclei, gamma rays or beta rays in response to irradiation with neutrons. The conversion film 6 can be represented by a conversion film for converting a neutron beam into the predetermined radiation described above.

Figure 2:
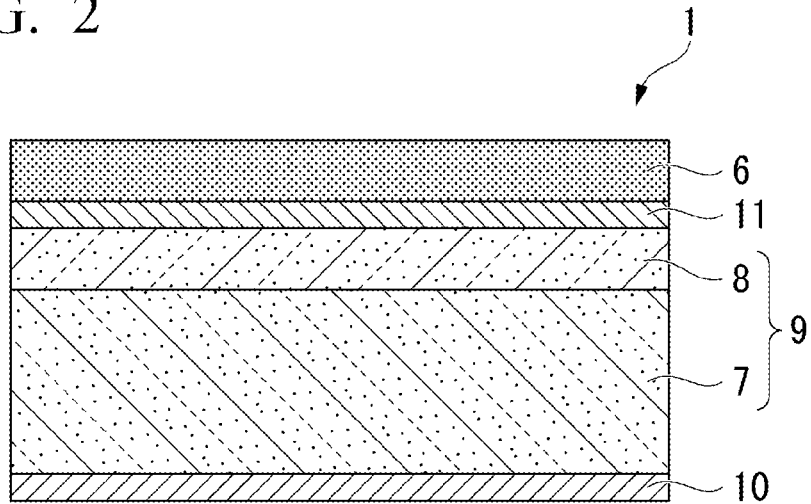
FIG. 2 is a diagram showing a cross-sectional structure of an InGaP solar cell-type detector to be applied to the neutron beam detecting device according to the first embodiment.

Main parts of a structure of the first solar cell-type detector 1 having the conversion film 6 are shown in FIG. 2.

The first solar cell-type detector 1 has a solar cell-type diode structure of p/n junction type in which a p-type semiconductor layer and an n-type semiconductor layer are joined, and has a structure in which, for example, a laminate 9 obtained by laminating a p-type layer 7 implemented with an InGaP layer and an n-type layer 8 implemented with an InGaP layer has an electrode layer 10 laminated on a back surface thereof, and has an electrode layer 11 laminated on a front surface thereof.

In the first solar cell-type detector 1, the electrode layer 11 serves as a front surface, and the electrode layer 10 and the electrode layer 11 are connected by wire connection to form a circuit. When the front surface is irradiated with radiation such as sunlight, electric power is generated, and a current can flow through the circuit.

In the first solar cell-type detector 1 according to the present embodiment, the conversion film 6 is laminated on a front surface of the electrode layer 11, and the conversion film 6 is attached to the first solar cell-type detector 1.

The radiation detector (second solar cell-type detector) 2 according to the present embodiment has the same structure as that of the first solar cell-type detector 1 except for the conversion film 6. That is, the radiation detector 2 has a solar cell-type diode structure of p/n junction type in which a p-type semiconductor layer and an n-type semiconductor layer are joined, and has a structure in which, for example, the laminate 9 obtained by laminating the p-type layer 7 implemented with an InGaP layer and the n-type layer 8 implemented with an InGaP layer has the electrode layer 10 laminated on the back surface thereof, and has the electrode layer 11 laminated on the front surface thereof.

In the first solar cell-type detector 1 and the radiation detector (second solar cell-type detector) 2, as a compound for semiconductor configuration that constitutes the p-type layer 7 or the n-type layer 8, more specifically, a binary compound semiconductor such as gallium arsenide (GaAs), indium phosphide (InP), and cadmium telluride (CdTe), a multinary mixture of ternary or quaternary or more such as indium gallium phosphide (InGaP), aluminum gallium arsenide (AlGaAs), and copper indium sulfide selenide, and a perovskite semiconductor can be applied.

Examples of the conversion film 6 includes a film made of a single element among lithium (Li), boron (B), or gadolinium (Gd) containing an isotope capable of converting neutrons into a charged particle beam or photons when being irradiated with the neutrons. The conversion film 6 may be a nitride film, a fluoride film, an oxide film, and other compound films of lithium, boron, and gadolinium. Alternatively, the conversion film 6 may include a mixture of a single element of any one of lithium, boron and gadolinium and a lithium compound, a boron compound, or a gadolinium compound.

When the neutrons are incident into the conversion film 6, the neutrons react with any element among lithium, boron, or gadolinium contained in the conversion film 6, and photons or any charged particle beam among protons, alpha particles (a particles), lithium nuclei, gamma rays or beta rays are generated toward various directions from a reaction position as a starting point.

For example, typical industrially obtained lithium has two isotopes including $^6$Li (lithium 6) and $^7$Li (lithium 7), where an abundance ratio of $^7$Li is about 93%, and an abundance ratio of $^6$Li is about 7%.

Typical industrially obtained boron has two isotopes including $^{10}$B (boron 10) and $^{11}$B (boron 11), where an abundance ratio of $^{10}$B is about 20%, and an abundance ratio of $^{11}$B is about 80%.

Further, typical industrially obtained gadolinium includes six kinds of natural isotopes including $^{154}$Gd (2.18%), $^{155}$Gd (14%), $^{156}$Gd (20.5%), $^{157}$Gd (15.6%), $^{158}$Gd (24.8%), and $^{160}$Gd (21.8%), and a radioisotope $^{152}$Gd (0.2%).

Due to the presence of the isotopes (presence of the radioisotope) in these elements, when these elements are irradiated with the neutrons, prompt charged particles such as alpha particles (nuclei of He) are emitted from the isotope elements, and thus the neutrons are converted into the alpha particles.

In response to irradiation with the neutrons, the conversion film 6 converts the neutrons into alpha particles, lithium nuclei, and gamma rays, but when a thickness of the conversion film 6 is excessively large, a part of the alpha particles, the lithium nuclei, and the gamma rays is attenuated inside the conversion film 6. Therefore, when the thickness of the conversion film 6 is increased more than necessary, a part of the alpha particles, the lithium nuclei, and the gamma rays is attenuated inside the conversion film 6, and thus the thickness of the conversion film 6 is preferably as thin as about 1 µm to 10 µm, for example, several µm.

On the other hand, a detection sensitivity and an amount of an output current can be reduced by further reducing the thickness of the conversion film 6 to be less than 1 µm. As a result, the conversion film 6 can also be applied in a high-flux neutron environment. For example, the first solar cell-type detector 1 having the conversion film 6 according to the present embodiment can be applied in a high-flux neutron environment such as a nuclear reactor or a peripheral equipment thereof. In a case of the high-flux neutron environment, the conversion film 6 can be formed, for example, to about 0.001 µm to 1 µm.

In addition, it is possible to reduce gamma-ray noise by thinning the conversion film 6 as described above.

The current measuring device 3 is electrically connected to the first solar cell-type detector 1, and the current measuring device 4 is electrically connected to the radiation detector (second solar cell-type detector) 2. Further, the flux calculating device 5 is electrically connected to the current measuring device 3 and the current measuring device 4. The current measuring device 3 can measure an induced current generated by the first solar cell-type detector 1 as a current signal, and the current measuring device 4 can measure an induced current generated by the radiation detector 2 as a current signal.

The flux calculating device 5 is provided with a difference calculating unit 15 that compares the current signals respectively measured by the current measuring devices 3 and 4 and calculates a difference between the current signals, and a flux calculating unit 16 that calculates a flux of neutrons from a difference current value as described below based on a calculation result of the difference calculating unit 15.

In order to calculate the flux of neutrons by the flux calculating unit 16, a relation to be described below is grasped in advance and is stored in a storage unit such as a memory provided in the flux calculating unit 16 in advance.

Among information stored in the flux calculating unit 16 in advance, first information is relational data on how many alpha particles are generated by the conversion film 6 applied to the first solar cell-type detector 1 with respect to the flux of the incident neutrons. Regarding the relational data, by using an accelerator-type neutron generation device or the like and controlling an amount of neutrons to be generated by an adjustment of the accelerator-type neutron generation device, a relation between a flux of a neutron beam to be incident into the conversion film 6 and a generation rate of the alpha particles generated in the conversion film 6 is obtained, for example, as shown in FIG. 3 obtained in an embodiment to be described later.

Figure 3:
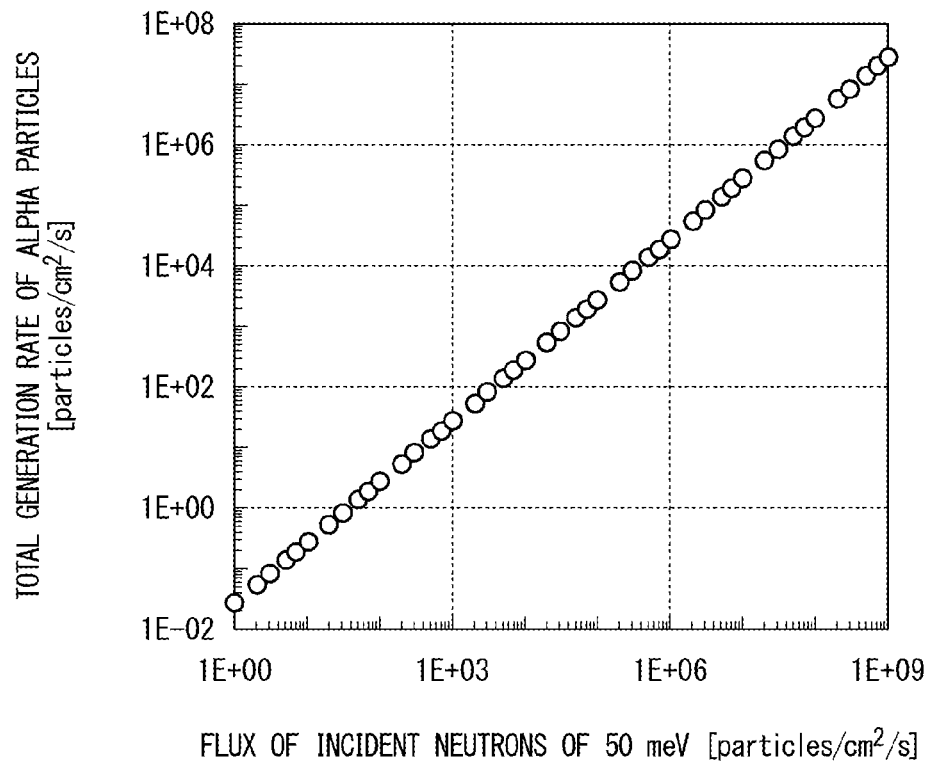
FIG. 3 is a graph showing a relation between a total amount, obtained by calculation, of alpha particles generated on a surface of a boron plate on a side closer to a solar cell and an incident amount of neutrons having an energy of 50 meV.

FIG. 3 shows a correlation between a value of a flux of incident neutrons having a specific energy (for example, 50 meV) [particles/cm$^2$/sec] (the number of particles per unit area and per unit time) and the generation rate of the alpha particles [particles/cm$^2$/sec]. When the relation in FIG. 3 is understood, the generation rate of the alpha particles, which indicates how many alpha particles are generated by the conversion film 6 in accordance with the flux of neutrons incident into the conversion film 6, can be known, and thus the relation shown in FIG. 3 is stored in the flux calculating unit 16 in advance.

Figure 4:
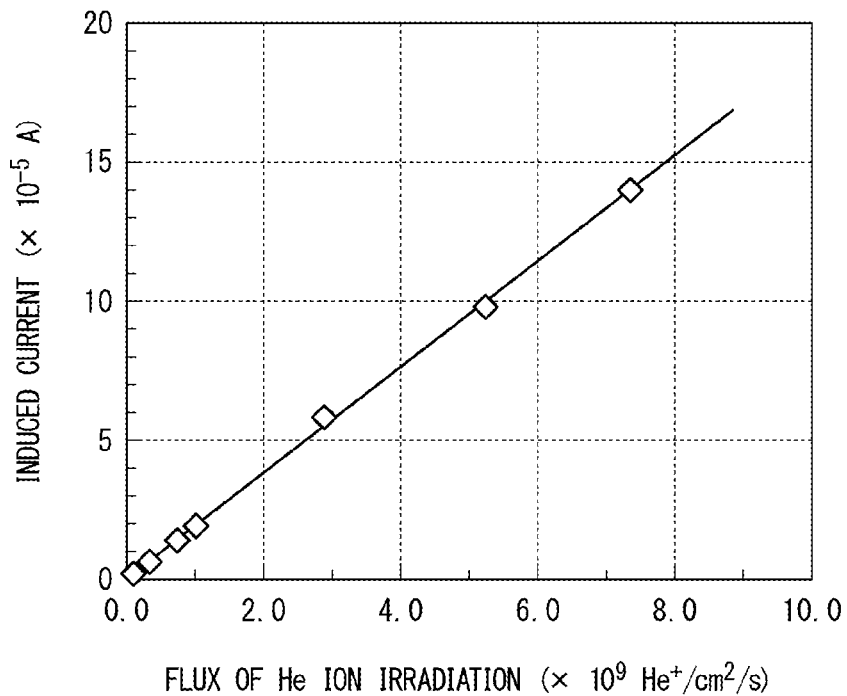
FIG. 4 is a graph showing a relation between a flux (flux of He ion irradiation) when alpha particles having an energy of 200 keV are incident and an output current (induced current) of an InGaP solar cell.

Among information stored in the flux calculating device 5 in advance, second information is a relation between a flux of the alpha particle irradiation and a current output of the first solar cell-type detector 1 when the first solar cell-type detector 1 without the conversion film 6 is irradiated with the alpha particles. Regarding the relational data, for example, as shown in the graph of FIG. 4 which is obtained in an example to be described later, a relation thereof is obtained in advance by setting a horizontal axis as the flux of the alpha particle irradiation (flux of He ion irradiation: ×10$^9$ He$^+$/cm$^2$/s), and setting a vertical axis as the induced current (×10$^{-5}$ A), and the relation shown in FIG. 4 is stored in the flux calculating device 5 in advance.

Next, since the flux of the neutrons that can be generated by the accelerator-type neutron generation device can be controlled by changing a current of an incident proton beam using the accelerator-type neutron generation device, the first solar cell-type detector 1 having the conversion film 6 and the radiation detector 2 without the conversion film 6 are arranged adjacently to be irradiated with the neutrons generated by the neutron generation device described above.

When this irradiation test is performed, as shown in a graph of FIG. 5 which is obtained in an example to be described later, it is possible to obtain a current output from the first solar cell-type detector 1 (having the conversion film) and a current output from the radiation detector 2 (without the conversion film).

Figure 5:
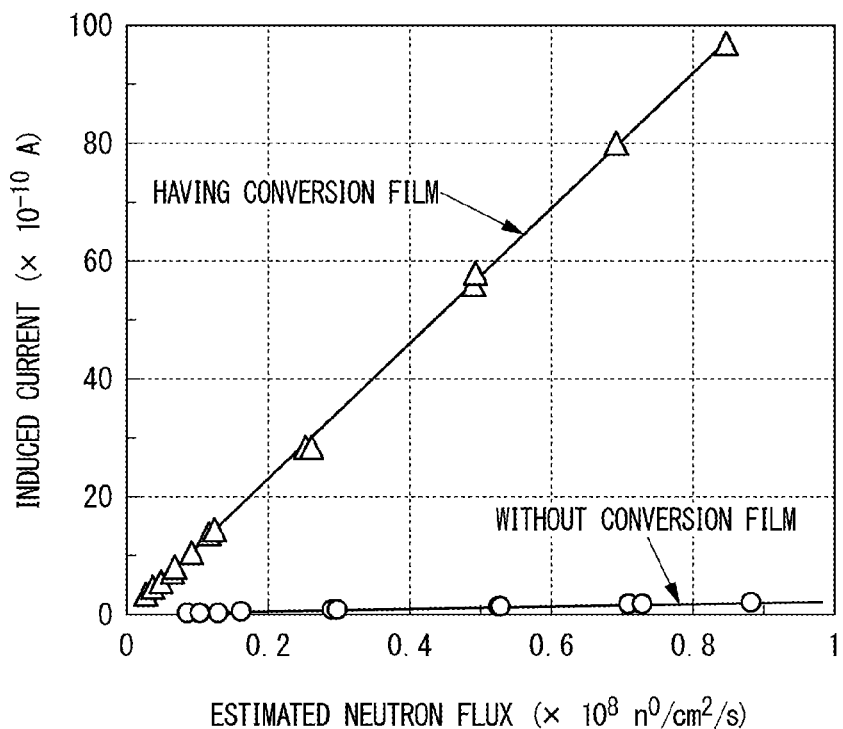
FIG. 5 is a graph showing currents (induced currents) generated by a solar cell having a conversion film and a solar cell without a conversion film when the solar cells are irradiated with neutrons by using a neutron generation device provided with an accelerator.

It can be understood that a current value obtained by subtracting the current output of the radiation detector 2 (without the conversion film) from the current output of the first solar cell-type detector 1 shown in the graph of FIG. 5 is a current generated by neutrons having a corresponding flux. That is, the current generated by the corresponding neutrons can be calculated by calculating the difference between the current signals of both the current measuring devices 3 and 4 using the difference calculating unit 15.

In the present embodiment, the calculation on the amount of neutrons based on a detected difference current can be performed by the flux calculating unit 16 provided at a final stage block shown in FIG. 1.

Examples of a calculation method include a method of previously obtaining relational data indicating how much current is induced by the solar cell-type detector 1 having the conversion film 6 with respect to the number of the alpha particles (see FIG. 3), and calculating the amount of neutrons based on relational data indicating how many alpha particles and lithium nuclei are generated with respect to the neutrons absorbed by the conversion film 6 (see FIG. 4).

Alternatively, it is also possible to adopt a method of measuring an induced current on the manufactured solar cell-type detector 1 in a calibration field in which the amount of neutrons is quantified in advance, and obtaining the amount of neutrons by proportional calculation based on a measured value. It is clear from a result shown in FIG. 4 that the amount of current is in proportion to the flux of neutrons by a linear function or a power function.

The proportional relation described above is a relation based on observation in a range of several tens of nA. In order to obtain the range in which linearity is guaranteed, it is possible to perform a linearity calibration test using light by utilizing characteristics of the solar cell.

Figure 10:
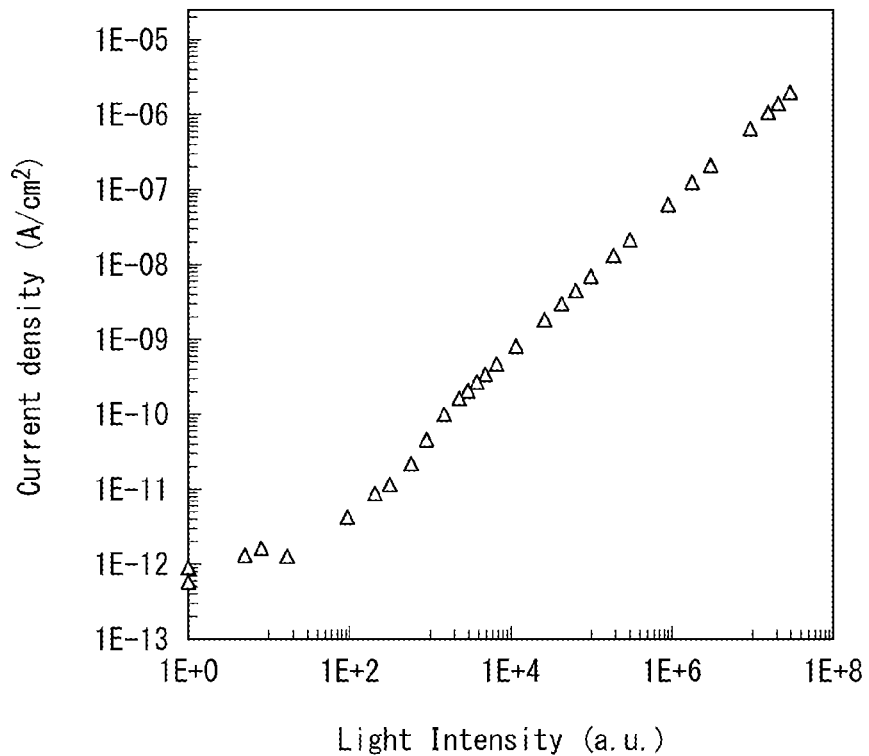
FIG. 10 is a graph showing a result of measuring an amount of a current (current density) to be generated when a monochromatic light source of 650 nm illuminates the solar cell-type detector while changing a light intensity.

For example, as shown in FIG. 10, by measuring the amount of current (current density) generated when the solar cell-type detector 2 is irradiated with a monochromatic light source of 650 nm while changing the light intensity, a behavior when a minute carrier generated in the semiconductor is taken out as a current to an external circuit is known.

The graph shown in FIG. 10 is a result obtained by inputting laser light (visible light) having a wavelength of 635 nm to, through a variable attenuator (0 to −60 dB) and a two-branch path, a photodiode and a solar cell-type detector that has a configuration of the solar cell-type detector 2 shown in FIG. 2 and is used in an example to be described later.

According to the data shown in FIG. 10, it can be known that in a region of a current density of 100 μA/cm$^2$ or more (about 1×10$^{-10}$ A/cm$^2$ or more), high linearity corresponding to the linear function or the power function continues up to several pA/cm$^2$. Therefore, it is considered that a radiation-induced current also exhibits linearity similar to that of the visible light described above.

In addition, in a region of 100 μA/cm$^2$ or less (about 1×10$^{-10}$ A/cm$^2$ or less), the linearity is distorted and a curve corresponding to the quadratic function is obtained. Therefore, by using an induced current behavior due to the visible light as the calibration curve of the solar cell-type detector 1, it is possible to analyze the flux of neutrons in a non-linear region.

Figure 15:
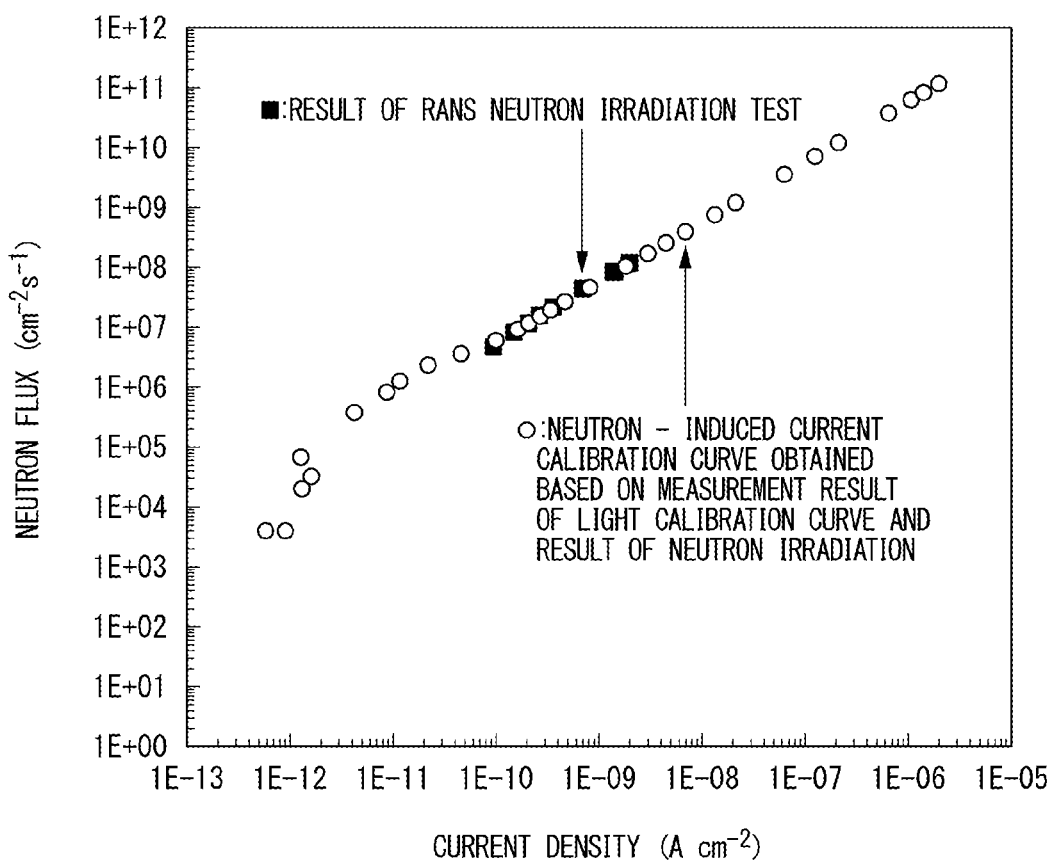
FIG. 15 is a graph illustrating a calibration curve that shows a relation between a current density and a flux of neutrons obtained when fitting is performed for each region with a linear function, a power function, or a quadratic function for data shown in FIG. 10.

For example, FIG. 15 shows data used for the calibration curve. By setting a value of the light intensity shown in FIGS. 10 to 4000 times, the induced current behavior due to irradiation of neutrons estimated from FIG. 5 is matched. The conversion of the flux of neutrons can be calculated by substituting the measured amount of current into a function formula obtained based on the calibration curve.

The region of the linear function or the power function shown in FIG. 15 is the region of 100 μA/cm$^2$ or more, and can be expressed by a relation of y=7E−14x+2E−09 when the region is fitted with a linear function of y=dx+e, and can be expressed by a relation of y=6×10$^{16}$ x$^{1.002}$+0 when the region is fitted with a power function of y=x$^d$+e.

Further, the region of the quadratic function is a region of 1 μA/cm$^2$ to 100 μA/cm$^2$, and can be expressed by a relation of y=−1E+27x$^2$+1E+17x−170469 when the region is fitted with a quadratic function of y=ax$^2$+bx+c.

That is, the calibration curve can be expressed by the relations of the fitted functions described above. The relation between the light intensity and the radiation-induced current can be obtained and understood as the flux of neutrons based on the calibration curve for each of these regions.

The solar cell-type detectors 1 and 2 of the present embodiment may be any solar cell device manufactured by using an existing solar cell manufacturing technique, and do not require a special design or manufacturing method for neutron measurement. This is because the currents can be directly obtained from the solar cell-type detectors 1 and 2.

In order to impart sensitivity to the neutrons, the conversion film 6 which generates a charged particle beam or photons in response to irradiation with the neutrons may be directly formed on and attached to a surface of the solar cell device by a film forming method such as coating method, vacuum deposition method, or sputtering method. Alternatively, a plate-shaped conversion film produced separately may be attached by, for example, merely being adhered to the surface of the solar cell device, which enables simple manufacture of the detector at low cost.

Figure 11:
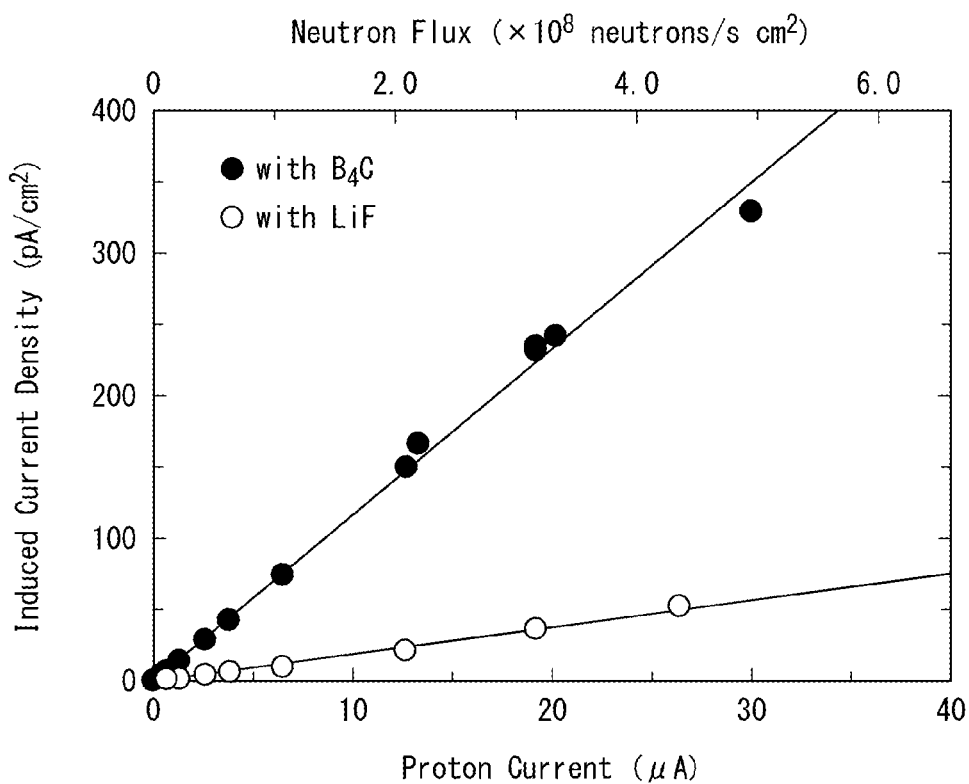
FIG. 11 is a graph showing a difference in sensitivity regarding neutrons with respect to a conversion film containing boron carbide ($B_4C$) and a conversion film containing lithium fluoride (LiF).

For example, by replacing the plate-shaped conversion film containing boron carbide (B$_4$C) or lithium fluoride (LiF) on the surface of the solar cell device, the sensitivity to the neutrons can be changed as shown in FIG. 11.

The conversion film in this case is not limited to a conversion film containing boron carbide or lithium fluoride, and a plate material or film material containing an element capable of converting neutrons into charged particles and photons as described above is also effective. A neutron absorption cross section has an energy dependency depending on elements, which enables a structure in which the conversion film can be easily replaced depending on an environment of the neutrons to be measured.

For example, according to an example shown in FIG. 11, in an environment having a large flux of neutrons to be measured, a conversion film containing lithium fluoride can be used, and in an environment having a low flux of neutrons to be measured, a conversion film containing boron carbide can be used.

Since the sensitivities/the magnitude of the output currents of the solar cell-type detectors 1 and 2 are proportional to an area of the solar cell device, it is possible to adjust the sensitivity according to the size of the solar cell device. By using this relation, it is possible to easily adjust the sensitivity to that of a detection region in accordance with the use.

For example, the sensor described in PLT 3 has no sensitivity to light, and thus cannot be subjected to sensitivity correction. In addition, there is a difference that a pulse signal amplified by a preamplifier using an external power supply based on a micro analog signal is measured, which is not a measurement by current signal measurement due to internal potential driving of the solar cell-type detectors 1 and 2.

A typical solar cell device made of an inorganic crystal-based material operates in a temperature range of about −150° C. to +300° C., and thus has an applicable temperature range wider than that of an existing neutron detector. By utilizing such high-temperature resistance, it is possible to measure the flux of neutrons in a high-temperature environment such as the inside of a nuclear reactor of a nuclear power plant or in direct vicinity of the nuclear reactor.

In addition, regarding the solar cell device, there is a concern that crystals may be damaged when exposed to radiation, and an output current may be deteriorated or decreased. Therefore, it is necessary to correct the deterioration of the neutron beam detecting device A according to the present embodiment when continuously used. Data on the decrease in the output current of the solar cell device to be adopted with respect to an exposure dose to radiation such as alpha particles, beta particles, and gamma rays is obtained in advance, and the data is provided as a database in the flux calculating unit, thereby enabling self-correction. If this correction is performed, it is possible to accurately measure the neutron beam even in a case where the solar cell device is continuously used for a long period of time in an environment exposed to radiation.

According to the present embodiment, a neutron detection unit may be a solar cell according to an existing technique, and it is not necessary to design and manufacture a dedicated detection device having a special structure. In addition, an internal electric field of a diode structure of a p/n junction is used to extract charges generated by the absorption of alpha particles, which does not need to apply a voltage. Therefore, a voltage source or a circuit or a wiring for voltage application is not required, and a neutron detection system may have a simple configuration and can be reduced in cost.

Further, it is sufficient to achieve the structure of the present embodiment by using a detector having a size of about 1 cm square as the solar cell-type detectors 1 and 2, and therefore the neutron detection unit can be reduced in size. As a result, it is possible to measure a neutron beam at a place where it is difficult to install the detector and the neutron beam cannot be measured hitherto, such as in the direct vicinity of a neutron generation unit of an accelerator-type neutron generation device.

Since the solar cell-type detectors 1 and 2 generate a current even when a radiation other than neutrons is absorbed, the output of the solar cell-type detector 1 provided with the conversion film 6 for neutrons/charged particle beam or photons includes a current due to the radiation other than neutrons. Therefore, it is necessary to detect the radiation other than the neutrons by the radiation detector insensitive to the neutrons and obtain a difference. This is the same for existing neutron detectors.

However, according to the structure according to the present embodiment, since the solar cell-type detector 2 without the conversion film 6 for the neutrons/the charged particle beam or the photons is used as the radiation detector insensitive to neutrons, simultaneous measurement at the same position is possible by installing the solar cell-type detector 2 and the solar cell-type detector 1 provided with the conversion film 6 in parallel, and an effect of improving the accuracy of the calculated neutron flux can be achieved.

According to the neutron beam detecting device A of the present embodiment, it is possible to provide a neutron beam detecting device capable of measuring and calculating a flux of a neutron beam within a wider detection range, at a lower price, within a wider usage temperature range, and in a smaller detector installation volume.

EXAMPLE

A solar cell device (hereinafter, referred to as an InGaP solar cell) was prepared by using a laminate of a p-type layer and an n-type layer made of InGaP. The InGaP solar cell includes an electrode implemented with a thin metal film (0.1 μm or less) for low contact resistance and a relatively thick metal film (0.1 μm or more) for reducing electrode resistance formed on surfaces of the laminate. The thin metal film is made of an alloy of gold, tin, zinc, and the like. The relatively thick metal film is made of molybdenum, ruthenium, iron, lead, zirconium or the like, which is not activated by neutrons to cause noise. A solar cell-type neutron detector having a laminate structure as shown in FIG. 2 was manufactured by bringing a boron plate into close contact with a surface of the InGaP solar cell. The boron plate has a thickness of 0.5 mm and was formed by sintering boron powder. At the same time, an InGaP solar cell without a boron plate and having the same structure and size was used as a detector for radiation other than neutrons.

The InGaP solar cells were irradiated with visible light and a reference radiation source such as alpha particles, beta particles, and gamma rays. A luminance and relational data on flux ratios and the output current were obtained in advance. At the same time, relational data on the irradiation flux and the decrease in the current output was also obtained in advance. FIG. 3 shows a relation between a flux of alpha rays (total generation rate of the alpha particles) and an intensity of the flux of the neutron beam (flux of the incident neutrons of 50 meV), and FIG. 4 shows a relation between the flux of the alpha particles (flux of He ion irradiation) and an excitation current (output current).

The InGaP solar cell-type detector having a boron plate and the InGaP solar cell-type detector without a boron plate were placed in parallel, and the solar cells of both were placed in the direct vicinity of a neutron generation unit of an accelerator-type neutron generation device that generates neutrons by accelerating protons to 7 MeV and causing the protons to collide with a beryllium plate, that is, in direct vicinity of a 40 mm polyethylene plate set as a moderator at a distance of 14 cm from the beryllium plate.

Output currents from the InGaP solar cell-type detector having a boron plate and the InGaP solar cell-type detector without a boron plate were measured while changing the flux of the generated neutrons by changing the current of the incident proton beam in the accelerator-type neutron generation device. FIG. 5 shows a relation between the flux of the neutrons calculated based on the current of the proton beam and the current output of the two InGaP solar cells. In the case of this neutron generation device, it is known that the current output of the InGaP solar cell without the boron plate was generated by absorbing the gamma rays generated at the same time as the neutrons and radiation caused by the activation of the InGaP solar cell per se.

It can be said that a current value obtained by subtracting an excitation current value of the InGaP solar cell-type detector without the conversion film shown in FIG. 5 from an excitation current value of the InGaP solar cell-type detector having the conversion film shown in FIG. 5 is a current value generated by the neutrons. Therefore, briefly, by knowing the value of the current generated by the neutrons described above, the flux of the neutrons emitted to the InGaP solar cell can be known in consideration of the relation shown in FIG. 4 and the relation shown in FIG. 3.

In addition, since the energy of the alpha particles generated by neutron absorption in the boron plate is different from the energy of the alpha particles (He ions) used in the experiment shown in FIG. 4, in order to know the flux of neutrons more strictly, the following relation is obtained.

Figure 6:
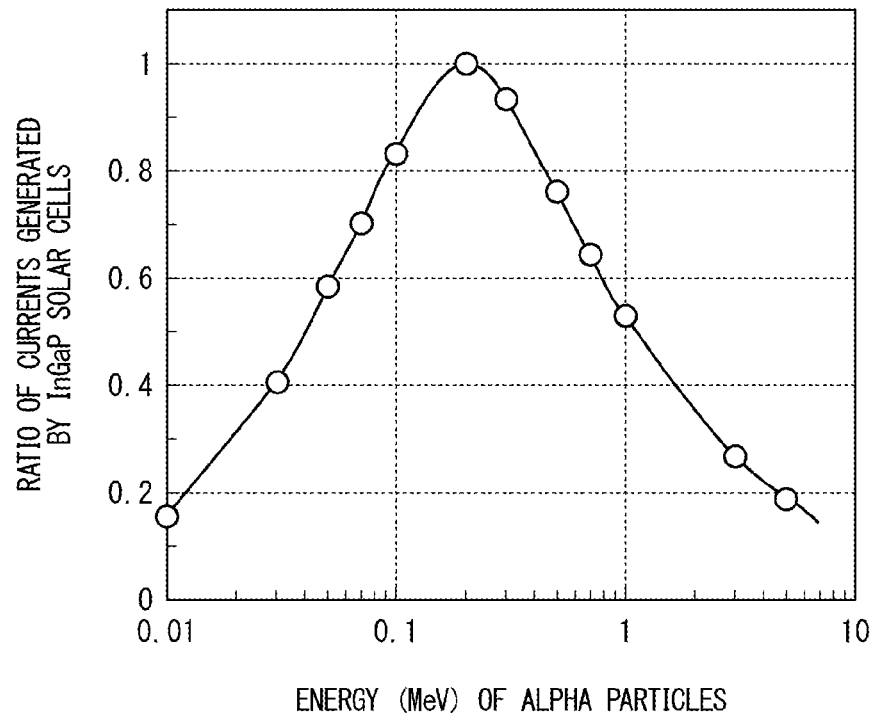
FIG. 6 is a graph showing a ratio of a magnitude of a current generated by the InGaP solar cell to the energy of the alpha particles (normalized assuming that a value of the alpha particles of 200 keV is 1).

Coefficients representing the relation between the neutrons and the generation rate of the alpha particles shown in FIG. 3 and stored in the flux calculating unit 16, the values of the excitation current and the irradiation flux of He ions shown in FIG. 4, and a generation ratio of current (normalized assuming that the value of the alpha rays of 200 keV is 1 in this case) calculated and actually measured by Monte Carlo simulation of the InGaP solar cell-type detector as shown in FIG. 6, for example, are grasped.

Figure 7:
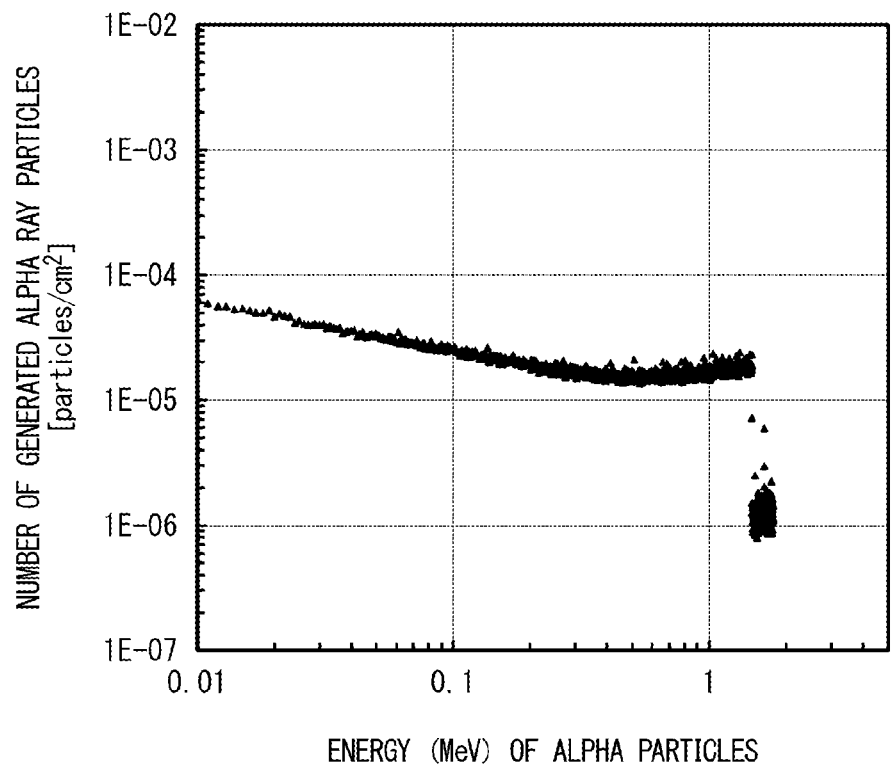
FIG. 7 is a graph showing a spectrum representing a relation between the energy of alpha particles, which are generated and emitted by one neutron incidence in a conversion film implemented with a boron film having a thickness of 0.05 mm, and the number of generated alpha particles on a surface of the boron film on a surface of a solar cell, the relation being calculated by Monte Carlo simulation, and is a graph for illustrating that this spectrum is the same for neutrons of any energy regardless of the energy of incident neutrons.

In addition, a spectrum representing a relation between the energy and the generation rate (the number of the generated alpha particles per unit time) of the alpha particles at an interface between a lower surface of the boron film and an upper surface of the InGaP solar cell-type detector as shown in FIG. 7, for example, is grasped. The alpha particles were released from the conversion film (boron film having a thickness of 0.05 mm), and the energy of the alpha particles was calculated or actually measured by Monte Carlo simulation.

It can be understood that the flux of neutrons can be calculated based on grasping the relation between the coefficients of FIGS. 3, 4, and 6 and the generation rate of FIG. 7 and the current value calculated by the difference calculation.

Hereinafter, a method for obtaining the number of neutrons from a detection current will be described.

First, a value of the detection current obtained by only the neutrons is obtained by subtracting the generated current in the InGaP solar cell-type detector without the conversion film from the generated current in the InGaP solar cell-type detector having the conversion film. This current is induced by the neutrons having an energy spectrum shown in FIG. 8.

Figure 8:
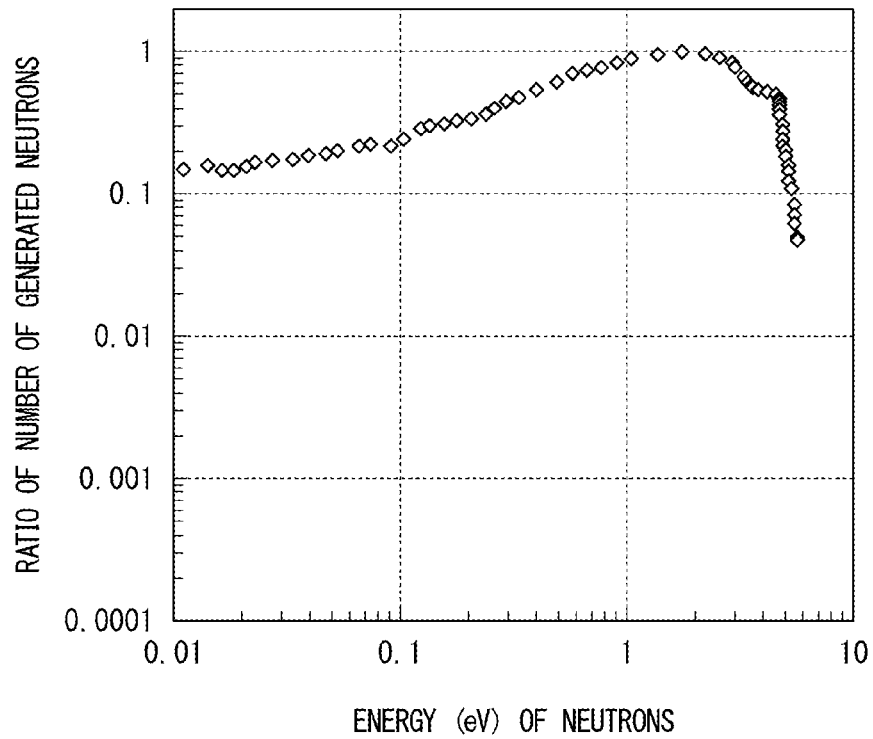
FIG. 8 is a diagram showing a spectrum representing a relation on a ratio of energy of neutrons generated by a neutron generation device used in an example to the number of the generated neutrons (normalized assuming that a peak energy value is 1).
Figure 9:
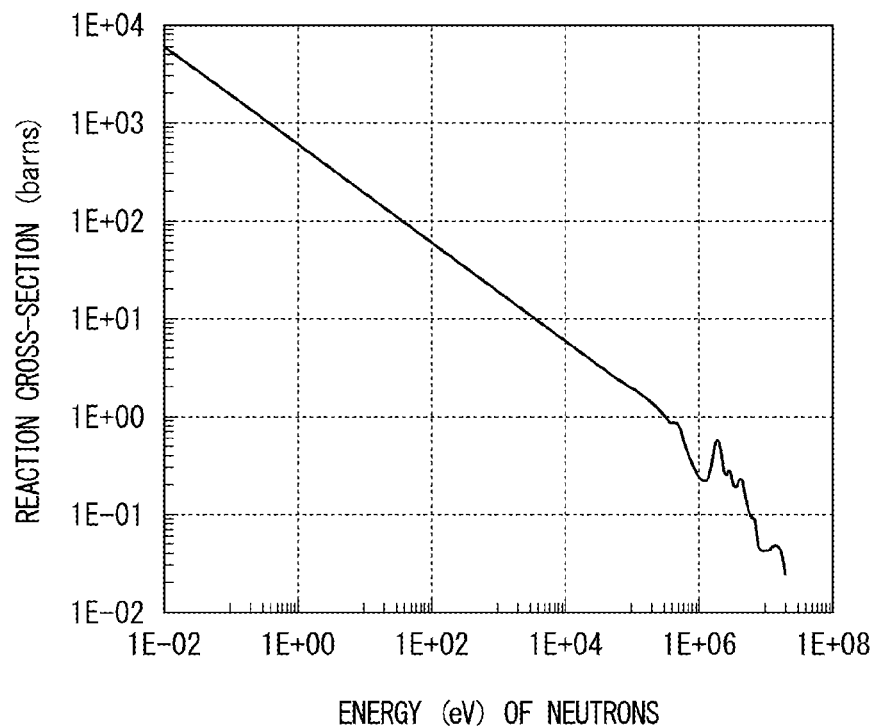
FIG. 9 is a graph showing a spectrum representing a relation between the energy of neutrons and a physical quantity called a reaction cross-section, which has a meaning equivalent to a probability of $^{10}B$ generating alpha particles by absorbing neutrons incident.

A probability that the boron film generates the alpha particles by the energy of the neutrons differs as shown in FIG. 9. Therefore, by multiplying a value of the vertical axis of FIG. 8 by a value of the vertical axis of FIG. 9, a relative value of the number of the alpha particles generated with respect to the energy of the neutrons in the neutron generation device is obtained.

When this relative value is normalized assuming that a value at the energy of 50 meV of the neutrons is 1, and is integrated over the entire energy range to obtain a value, a ratio of the number of generated alpha particles when the numbers of alpha particles generated by neutrons of all energies are all converted to the number of alpha particles generated by the neutrons of 50 meV can be obtained.

When this value is multiplied by a value of the vertical axis of FIG. 3, a relation between the total amount of alpha particles generated on the surface of the boron film on the side closer to the solar cell and the amount of incident neutrons in the neutron beam detecting device is obtained. This relation is referred to as F.

On the other hand, the relation between the number of alpha particles generated in response to the incidence of neutrons and the energy of the alpha particles is shown in FIG. 7. By multiplying a value of the vertical axis of FIG. 7 by a value of the vertical axis of FIG. 6, a relative value of a current generated in the InGaP solar cell with respect to the energy of the alpha particles from the boron film is obtained.

FIG. 7 is a graph showing a spectrum representing a relation between the energy of alpha particles generated and emitted by one neutron incidence in a conversion film implemented with a boron film having a thickness of 0.05 mm and the number of generated alpha particles on a surface of the boron film on a side closer to the solar cell, which is calculated by Monte Carlo simulation. The spectrum shown in FIG. 7 is the same for incident neutrons of any energy regardless of the energy of the neutrons.

When the relative value is normalized assuming that a value at the energy of 200 keV of the alpha particles is 1, and is integrated over the entire energy range to obtain a value, this value is a ratio of current value when currents generated by alpha particles of all the energies are converted to a current generated by the alpha particles of 200 keV.

Next, a corresponding flux value of the alpha particles of the horizontal axis can be obtained from the graph by applying a current value, which is obtained by multiplying the value of the detection current previously obtained with only the neutrons by the ratio of current value, to the vertical axis of FIG. 4. By applying the flux value to the above-described relation F, the amount of generated neutrons (flux) can be obtained.

In addition, in application of the invention, the energy spectrum of the generated neutrons as shown in FIG. 8 is necessary. In a nuclear reactor or the like which is an example of the application target, the energy spectrum of the generated neutrons may be known in advance. In a case where the energy spectrum is unknown, the energy spectrum of the generated neutrons can be obtained by measurement, nuclear reaction simulation, or the like. In these cases, the energy spectrum of the generated neutrons that is known in advance may be used as a substitute for FIG. 8.

As described above, the sensitivity of the conversion film can be changed depending on the film thickness.

Figure 12:
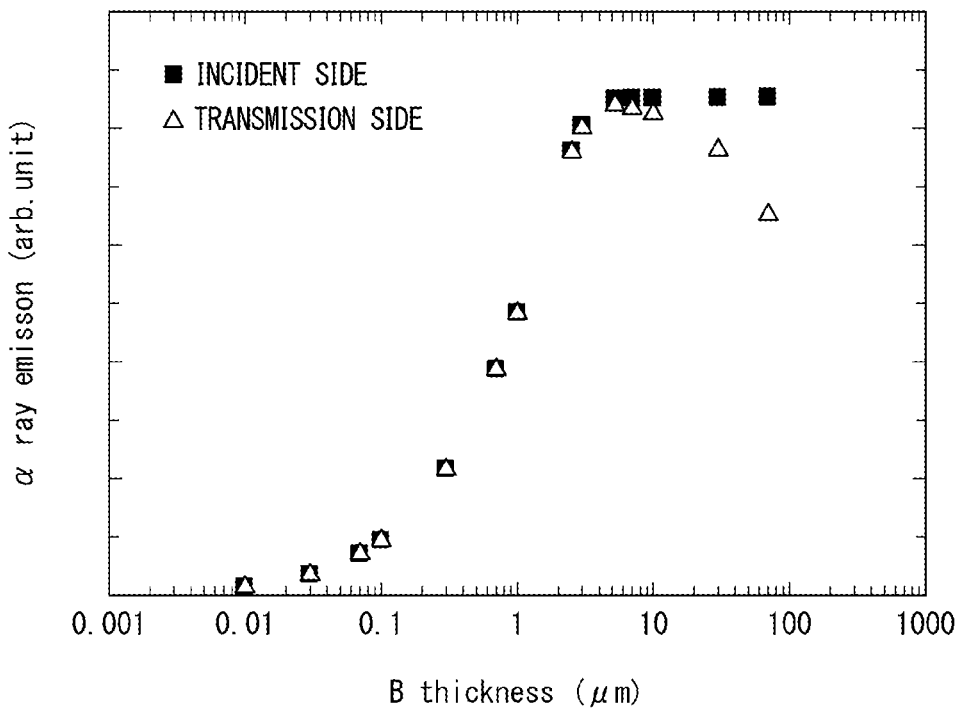
FIG. 12 is a graph showing a film thickness dependency of an amount of alpha particles emitted from an incident side and a transmission side of neutrons of 25 meV when the neutrons are incident into a conversion film containing boron.

FIG. 12 is a graph showing a film thickness dependency of an amount of alpha particles emitted from an incident side and a transmission side of neutrons of 25 meV when the neutrons are incident into a conversion film containing boron.

According to FIG. 12, when the film thickness of the conversion film is several μm or less (for example, 4 μm or less), the amounts of emitted neutrons on the incident side and on the transmission side are almost the same. On the other hand, when the film thickness is several μm or more (for example, more than 4 μm), the amount of alpha particles emitted from the incident side is saturated, whereas the amount of alpha particle emitted from the transmission side decreases as the film thickness increases.

A reason why the amount of alpha particles emitted from the incident side is saturated is that since a range of the alpha particles in the conversion film is several µm, the alpha particles generated at a position thicker than the several µm in the conversion film containing boron are blocked by the conversion film containing boron and are not emitted.

A reason why the amount of alpha particle emitted from the transmission side decreases is that the amount of neutrons reaching the transmission side decreases due to the absorption of the neutrons inside the conversion film containing boron. Therefore, it is possible to control sensitivity characteristics and a directional dependency of the detector by controlling the film thickness of the conversion film.

The film thickness dependency of the amount of the charged particles and the photons emitted from the surface is not limited to boron and alpha particles, and is applied to a plate that can convert neutrons into charged particles and photons, such as boron and lithium, boron and gamma rays, lithium and proton rays, lithium and alpha particles, and gadolinium and gamma rays.

When the output of the solar cells of the two InGaP solar cell devices, that is, the current output when the solar cells were irradiated with light was measured before and after the measurement in this example, it was confirmed that no deterioration due to exposure to radiation was observed and deterioration correction was not necessary. In this way, it is possible to check the deterioration of the detector caused by the solar cell such as InGaP by a simple method of measuring the output of the solar cell.

Figure 13:
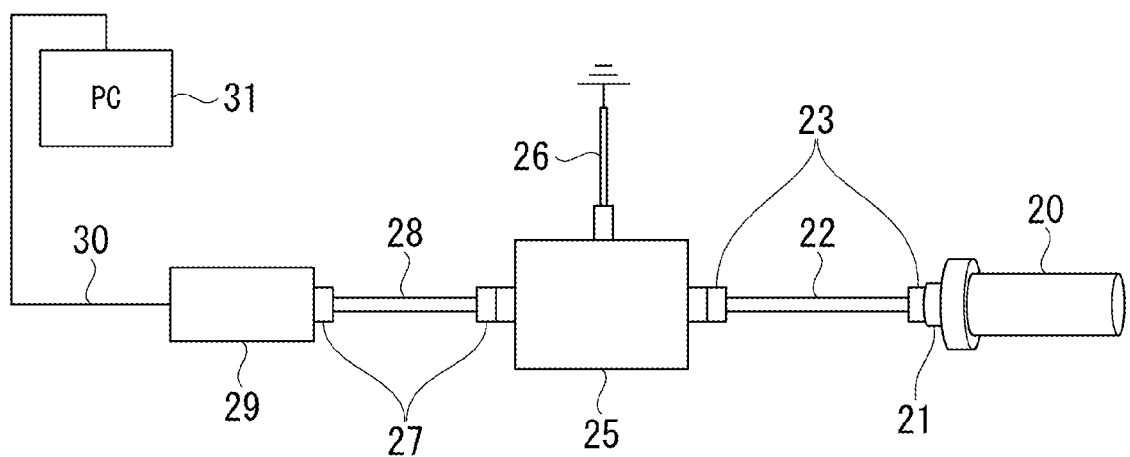
FIG. 13 is a configuration diagram showing an embodiment of a neutron beam measurement system S provided with a neutron beam detecting device A shown in FIG. 1.

FIG. 13 is a configuration diagram showing an embodiment of the neutron beam measurement system S provided with the neutron beam detecting device A shown in FIG. 1.

The first solar cell-type detector 1 and the second solar cell-type detector 2 are housed in a sensor housing portion 20. An output line of the first solar cell-type detector 1 and an output line of the second solar cell-type detector 2 are each connected to a noise filter 25 via a sub miniature type A (SMA) connector 21, a connection cable 22, and an SMA connector 23. The connection cable 22 is preferably a shield line.

A part of internal wirings in a wiring box 25 of the noise filter 25 is grounded by a ground wire 26. By connecting the output line of the first solar cell-type detector 1 and the output line of the second solar cell-type detector 2 to the noise filter 25, a noise component of currents generated in the first solar cell-type detector 1 and the second solar cell-type detector 2 in a radiation environment can be removed.

As the noise component, noise from a minute ripple voltage generated by a measurement system or noise generated when charging the system by radiation is considered. The noise caused by the ripple voltage can be removed using mainly a capacitor or a low-pass filter. In addition, the noise caused by charging due to radiation can be removed by grounding the measurement system.

An output side of the noise filter 25 is connected to a micro ammeter 29 via a BNC connector 27 and a coaxial cable 28, and the micro ammeter 29 is connected to an arithmetic device 31 such as a personal computer via a digital signal cable 30. The difference calculating unit 15 and the flux calculating unit 16 shown in FIG. 1 are incorporated in the arithmetic device 31.

The micro ammeter 29 performs A/D conversion of currents transmitted from the output line of the first solar cell-type detector 1 and the output line of the second solar cell-type detector 2. As described above, the difference calculating unit 15 and the flux calculating unit 16 incorporated in the arithmetic device 31 can convert the current signal into the flux ratio, and can calculate the flux of neutrons at the time of this conversion by using the calibration curve generated based on the visible light or the reference radiation source described above.

The neutron beam measurement system S described above can be represented as a system that performs a step of reading a current value as a first step, performs a step of reading a calibration curve as a second step, performs a neutron flux calculation based on the calibration curve and the amount of current as a third step, and performs flux output of a neutron beam as a fourth step.

Figure 14:
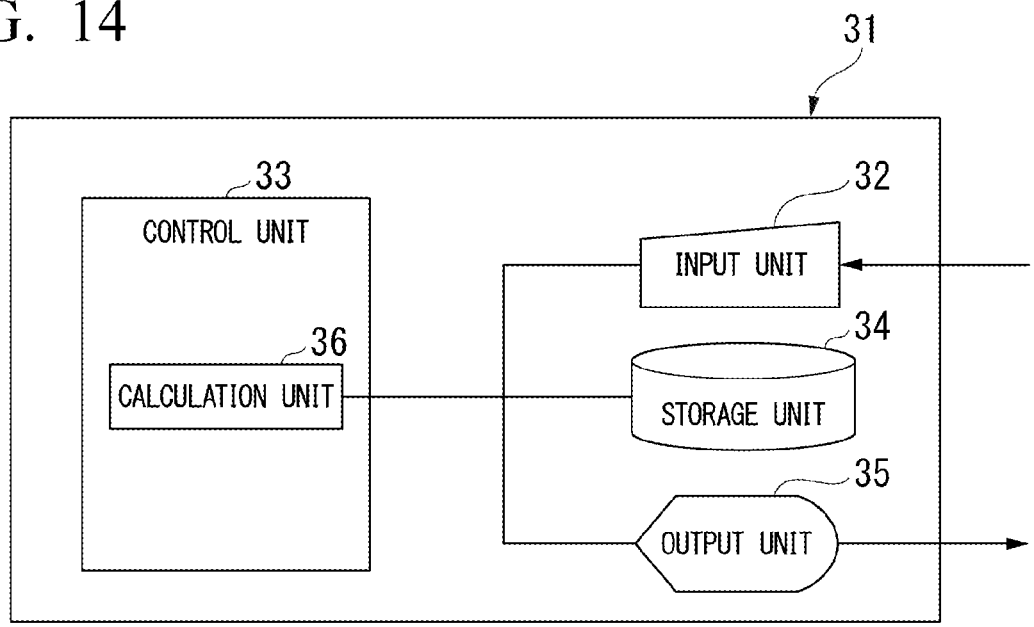
FIG. 14 is a configuration diagram illustrating an example of a computer (arithmetic device) that stores programs to be used by the neutron beam detecting device according to the first embodiment.

As an example, the arithmetic device 31 such as a personal computer shown in FIG. 13 includes an input unit 32, a control unit 33, a storage unit 34, and an output unit 35 as shown in FIG. 14.

The input unit 32 is, for example, a keyboard for inputting characters and numerals, and various kinds of information can be input to the control unit 33 or the storage unit 34 by the input unit 32.

The control unit 33 includes so-called central processing unit (CPU), random access memory (RAM), read only memory (ROM) and the like, and can perform various numerical calculation, information processing, device control and the like by various programs.

The storage unit 34 is, for example, an information recording medium such as a solid state drive (SSD) or a hard disk drive (HDD), and can store various programs, various types of information that are necessary for execution by a calculation unit 36 and are stored in, for example, the storage unit of the flux calculating unit 16 described previously in advance as described above, results obtained based on these programs and information and the like as necessary, or can read storage content thereof.

The output unit 35 is, for example, a monitor, a printer or the like, and can display or print information such as various relation to be described later on a screen or on a surface of paper as necessary in addition to various types of information obtained from various programs stored in the storage unit 34.

In addition, by storing necessary programs and various types of information necessary for the execution by the calculation unit 36 to be described later before executing the programs in the storage unit 34 in advance, the programs and the information can be freely read and operated. In addition, a calculation result or the like obtained by executing the program can be stored or read as necessary. Obviously, the storage unit 34 may have a communication function to the Internet or a network, and the storage unit 34 may be able to perform a calculation and to calculate a result in the same manner as the arithmetic device 31 by using a storage unit, a calculation unit, and a prediction unit provided in other personal computers connected to the Internet or the network.

The information stored in the storage unit 34 is, for example, the first information and the second information, which are the same as the above-described information stored in the flux calculating unit 16 for the neutrons in advance. As described above, the relation shown in FIG. 3 may be obtained and stored based on the first information, and the relation shown in FIG. 4 may be obtained and stored based on the second information.

Based on such information, the calculation unit 36 performs the same calculation as that of the above-described difference calculating unit 15, and calculates the difference between the current signals of the current measuring devices 3 and 4 as described above, and can calculate the flux of neutrons based on the relational data shown in FIG. 3 and the relational data shown in FIG. 4. In addition, by using the fact that the amount of current follows a proportional relation by a power function with respect to the neutron flux based on the graph shown in FIG. 15 as described above, the calculation unit 36 may have a function of calculating the neutron flux by a fitting function.

Further, the storage unit 34 and the calculation unit 36 may have a function capable of analyzing the neutron flux in the non-linear region based on the relation of the quadratic function by using the calibration curve of the solar cell-type detector 1 described above, based on the graph shown in FIG. 15.

The program described above uses the first solar cell-type detector 1 and the radiation detector 2, the first solar cell-type detector 1 being provided with, on the surface thereof, the conversion film for converting neutrons into photons or any charged particle beam among alpha particles, protons, lithium nuclei, gamma rays or beta rays, and generating a current in response to radiation incident, the radiation detector 2 generating a current insensitive to neutrons as an output signal in response to the incident radiation, and causes the current measuring device 3 to detect, as signals, the current generated by the first solar cell-type detector 1 and the current generated by the radiation detector 2 in response to the incident radiation.

Further, the program can be described as a program that causes the arithmetic device (computer) 31 to function as a comparison unit for, by the calculation unit (flux calculating unit) 36, comparing the current signal generated by the first solar cell-type detector 1 and the current signal generated by the radiation detector 2 which are detected by the current measuring devices 3 and 4, and as a unit for, by the calculation unit (flux calculating unit) 36, associating the current signals from the solar cell-type detector 1 and the radiation detector 2 detected by the current measuring devices 3 and 4 with the relation between the flux of incident radiation of a predetermined line type obtained in advance and the detected currents from the solar cell-type detector and the radiation detector, and calculating the flux of the neutron beams based on the result of the association.

Similarly, when the difference calculating unit 15 and the flux calculating unit 16 described above perform measurement in the environment in which the neutron flux to be measured is large and the environment in which the neutron flux is small based on FIG. 11, the measurement can be performed by programs incorporated in the arithmetic device 31 in the same manner as the difference calculating unit 15 and the flux calculating unit 16.

Further, by providing the functions of the difference calculating unit 15 and the flux calculating unit 16 having the function of calculating the neutron flux based on the relations shown in FIGS. 3 to 12 described in the example as respective programs in the storage unit 34 and the calculation unit 36, and executing these programs provided in the storage unit 34, it is possible to employ a configuration capable of calculating the neutron flux as described above in the same manner as in the description of the example.

INDUSTRIAL APPLICABILITY

The neutron beam detecting device according to the invention can be applied to monitoring of neutron flux in a high temperature and high flux environment, such as in the direct vicinity of a nuclear reactor.

In addition, the neutron beam detecting device according to the invention can be applied to monitoring of neutron flux in a narrow environment such as in the direct vicinity of a neutron generating material of an acceleration type neutron generation device.

REFERENCE SIGN LIST

A neutron beam detecting device
S neutron beam detection system
1 first solar cell-type detector
2 radiation detector (second solar cell-type detector)
3, 4 current measuring device
5 flux calculating device
6 conversion film
7 P layer
8 N layer
9 laminate
10, 11 electrode layer
12 conversion film
15 difference calculating unit
16 flux calculating unit
25 noise filter
26 ground wire
29 micro ammeter
31 arithmetic device (personal computer)
32 input unit
33 control unit
34 storage unit
35 output unit
36 calculation unit

The invention claimed is:

1. A neutron beam detecting device for detecting a neutron beam, comprising:
   a solar cell-type detector provided with, on a surface thereof, a conversion film configured to convert neutrons into a predetermined radiation, and configured to generate a current in response to radiation incident through the conversion film;
   a radiation detector configured to generate a current insensitive to neutrons as an output signal in response to the incident radiation;
   a current measuring device configured to detect, as signals, the current generated by the solar cell-type detector and the current generated by the radiation detector in response to the incident radiation; and
   a flux calculating unit configured to compare the current signal generated by the solar cell-type detector and the current signal generated by the radiation detector which are detected by the current measuring device, wherein
   the flux calculating unit has a function of associating the current signals from the solar cell-type detector and the radiation detector detected by the current measuring device with a relation between a flux of an incident radiation of a predetermined type obtained in advance and the detected currents from the solar cell-type detector and the radiation detector, and calculating a flux of a neutron beam based on a result of the association.

2. The neutron beam detecting device according to claim 1, wherein
   the solar cell-type detector is a first solar cell-type detector,
   the radiation detector is a second solar cell-type detector that is not provided with a conversion film for converting neutrons into a predetermined radiation, and
   the flux calculating unit calculates the difference between the current signal from the first solar cell-type detector and the current signal from the second solar cell-type detector, and has a function of associating the difference with a relation between a flux of incident neutrons of a predetermined type obtained in advance and the difference between the current signal from the first solar cell-type detector and the current signal from the second solar cell-type detector, and calculating the flux of the neutron beam based on a result of the association.

3. The neutron beam detecting device according to claim 2, wherein
the neutron beam detecting device has a function of calculating the flux of neutrons based on a calibration curve based on a linear function, a power function or a quadratic function stored in the flux calculating unit in advance.

4. The neutron beam detecting device according to claim 1, wherein
the conversion film is made of any one of:
a single element among lithium, boron, or gadolinium containing an isotope having a function of converting neutrons into photons or any charged particle beam among alpha particles, protons, lithium nuclei, gamma rays or beta rays;
a nitride, a fluoride, an oxide, or other compounds of lithium, boron, or gadolinium containing an isotope having a function of converting neutrons into photons or any charged particle beam among alpha particles, protons, lithium nuclei, gamma rays or beta rays; or
a mixture of the single element and the compound.

5. The neutron beam detecting device according to claim 1, wherein
the solar cell-type detector is made of any one of:
a binary compound semiconductor having a band gap of 0.8 eV to 2.2 eV, such as gallium arsenide, indium phosphide, and cadmium telluride;
a compound semiconductor that is a multinary mixture of ternary or quaternary or more, such as indium gallium phosphide, aluminum gallium arsenide, and copper indium sulfide selenide; or
a perovskite semiconductor.

6. A neutron beam detecting method for detecting a neutron beam, comprising:
using a solar cell-type detector and a radiation detector, the solar cell-type detector being provided with, on a surface thereof, a conversion film configured to convert neutrons into a predetermined radiation, and being configured to generate a current in response to radiation incident through the conversion film, the radiation detector being configured to generate a current insensitive to neutrons as an output signal in response to the incident radiation;
causing a current measuring device to detect, as signals, a current generated by the solar cell-type detector and a current generated by the radiation detector in response to the incident radiation;
causing a flux calculating unit to compare the current signal generated by the solar cell-type detector and the current signal generated by the radiation detector which are detected by the current measuring device; and
causing the flux calculating unit to associate the current signals from the solar cell-type detector and the radiation detector detected by the current measuring device with a relation between a flux of incident radiation of a predetermined type obtained in advance and the detected currents from the solar cell-type detector and the radiation detector, and to calculate a flux of a neutron beam based on a result of the association.

7. The neutron beam detecting method according to claim 6, wherein
the solar cell-type detector is a first solar cell-type detector,
the radiation detector is a second solar cell-type detector that is not provided with a conversion film for converting neutrons into a predetermined radiation, and
the flux calculating unit calculates the difference between the current signal from the first solar cell-type detector and the current signal from the second solar cell-type detector, and has a function of associating the difference with a relation between a flux of incident neutrons of a predetermined type obtained in advance and the difference between the current signal from the first solar cell-type detector and the current signal from the second solar cell-type detector, and calculating the flux of the neutron beam based on the result of the association.

8. The neutron beam detecting method according to claim 7, further comprising:
calculating the flux of neutrons based on a calibration curve based on a linear function, a power function or a quadratic function stored in the flux calculating unit in advance.

9. The neutron beam detecting method according to claim 6, wherein
the conversion film is made of any one of:
a single element among lithium, boron, or gadolinium containing an isotope having a function of converting neutrons into photons or any charged particle beam among alpha particles, protons, lithium nuclei, gamma rays or beta rays;
a nitride, a fluoride, an oxide, or other compounds of lithium, boron, or gadolinium containing an isotope having a function of converting neutrons into photons or any charged particle beam among alpha particles, protons, lithium nuclei, gamma rays or beta rays; or
a mixture of the single element and the compound.

10. The neutron beam detecting method according to claim 6, wherein
the solar cell-type detector is made of any one of:
a binary compound semiconductor having a band gap of 0.8 eV to 2.2 eV, such as gallium arsenide, indium phosphide, and cadmium telluride;
a compound semiconductor that is a multinary mixture of ternary or quaternary or more, such as indium gallium phosphide, aluminum gallium arsenide, and copper indium sulfide selenide; or
a perovskite semiconductor.

11. A neutron beam detection program used in a neutron beam detecting method for detecting a neutron beam, the program being executed to:
use a solar cell-type detector and a radiation detector, the solar cell-type detector being provided with, on a surface thereof, a conversion film configured to convert neutrons into a predetermined radiation, and being configured to generate a current in response to radiation incident through the conversion film, the radiation detector being configured to generate a current insensitive to neutrons as an output signal in response to the incident radiation;
cause a current measuring device to detect, as signals, a current generated by the solar cell-type detector and a current generated by the radiation detector in response to the incident radiation;

use a flux calculating unit that compares the current signal generated by the solar cell-type detector and the current signal generated by the radiation detector which are detected by the current measuring device; and cause the flux calculating unit to associate the current signals from the solar cell-type detector and the radiation detector detected by the current measuring device with a relation between a flux of incident radiation of a predetermined type obtained in advance and the detected currents from the solar cell-type detector and the radiation detector, and to calculate a flux of a neutron beam based on a result of the association.

12. The neutron beam detection program according to claim 11, wherein the solar cell-type detector is a first solar cell-type detector, the radiation detector is a second solar cell-type detector that is not provided with a conversion film for converting neutrons into a predetermined radiation, and the flux calculating unit calculates the difference between the current signal from the first solar cell-type detector and the current signal from the second solar cell-type detector, and has a function of associating the difference with a relation between a flux of incident neutrons of a predetermined type obtained in advance and the difference between the current signal from the first solar cell-type detector and the current signal from the second solar cell-type detector, and calculating the flux of the neutron beam based on the result of the association.

13. The neutron beam detection program according to claim 12, wherein the neutron beam detection program has a function of calculating the flux of neutrons based on a calibration curve based on a linear function, a power function or a quadratic function stored in the flux calculating unit in advance.

14. The neutron beam detection program according to claim 11, wherein the conversion film is made of any one of:

a single element among lithium, boron, or gadolinium containing an isotope having a function of converting neutrons into photons or any charged particle beam among alpha particles, protons, lithium nuclei, gamma rays or beta rays;

a nitride, a fluoride, an oxide, or other compounds of lithium, boron, or gadolinium containing an isotope having a function of converting neutrons into photons or any charged particle beam among alpha particles, protons, lithium nuclei, gamma rays or beta rays; or a mixture of the single element and the compounds.

15. The neutron beam detection program according to claim 11, wherein the solar cell-type detector is made of any one of:

a binary compound semiconductor having a band gap of 0.8 eV to 2.2 eV, such as gallium arsenide, indium phosphide, and cadmium telluride;

a compound semiconductor that is a multinary mixture of ternary or quaternary or more, such as indium gallium phosphide, aluminum gallium arsenide, and copper indium sulfide selenide; or a perovskite semiconductor.

* * * * *